United States Patent
Chiu et al.

(10) Patent No.: US 10,020,385 B2
(45) Date of Patent: Jul. 10, 2018

(54) MEMORY CELL AND MANUFACTURING METHOD THEREOF

(71) Applicant: UNITED MICROELECTRONICS CORP., Hsin-Chu (TW)

(72) Inventors: Yi-Shan Chiu, Taoyuan County (TW); Shen-De Wang, Hsinchu County (TW); Zhen Chen, Singapore (SG); Yuan-Hsiang Chang, Hsinchu (TW); Chih-Chien Chang, Hsinchu (TW); Jianjun Yang, Singapore (SG); Wei Ta, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/220,122

(22) Filed: Mar. 19, 2014

(65) Prior Publication Data
US 2015/0270277 A1    Sep. 24, 2015

(51) Int. Cl.
*H01L 29/792*    (2006.01)
*H01L 29/66*    (2006.01)
*H01L 29/423*    (2006.01)
*H01L 27/1157*    (2017.01)

(52) U.S. Cl.
CPC .... *H01L 29/66833* (2013.01); *H01L 27/1157* (2013.01); *H01L 29/42344* (2013.01); *H01L 29/792* (2013.01)

(58) Field of Classification Search
CPC ...................................................... H01L 29/792
USPC ......................................................... 257/326
See application file for complete search history.

(56) References Cited

U.S. PATENT DOCUMENTS

| | | | |
|---|---|---|---|
| 6,885,044 B2 | 4/2005 | Ding | |
| 2003/0198086 A1* | 10/2003 | Shukuri | 365/185.18 |
| 2007/0207581 A1* | 9/2007 | Yasui | H01L 21/28273 438/257 |
| 2010/0059810 A1* | 3/2010 | Homma | H01L 27/11 257/324 |
| 2014/0252445 A1* | 9/2014 | Chen | H01L 21/28273 257/316 |

* cited by examiner

*Primary Examiner* — Hsin-Yi Hsieh
(74) *Attorney, Agent, or Firm* — Winston Hsu

(57) ABSTRACT

The present invention provides a memory cell, which includes a substrate, a gate dielectric layer, a patterned material layer, a selection gate and a control gate. The gate dielectric layer is disposed on the substrate. The patterned material layer is disposed on the substrate, wherein the patterned material layer comprises a vertical portion and a horizontal portion. The selection gate is disposed on the gate dielectric layer and atone side of the vertical portion of the patterned material layer. The control gate is disposed on the horizontal portion of the patterned material layer and at another side of the vertical portion, wherein the vertical portion protrudes over a top of the selection gate. The present invention further provides another embodiment of a memory cell and manufacturing methods thereof.

7 Claims, 6 Drawing Sheets

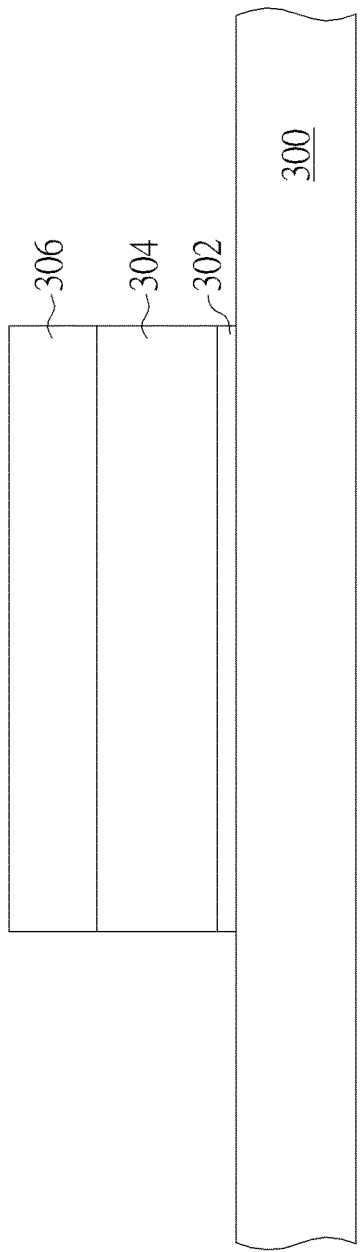
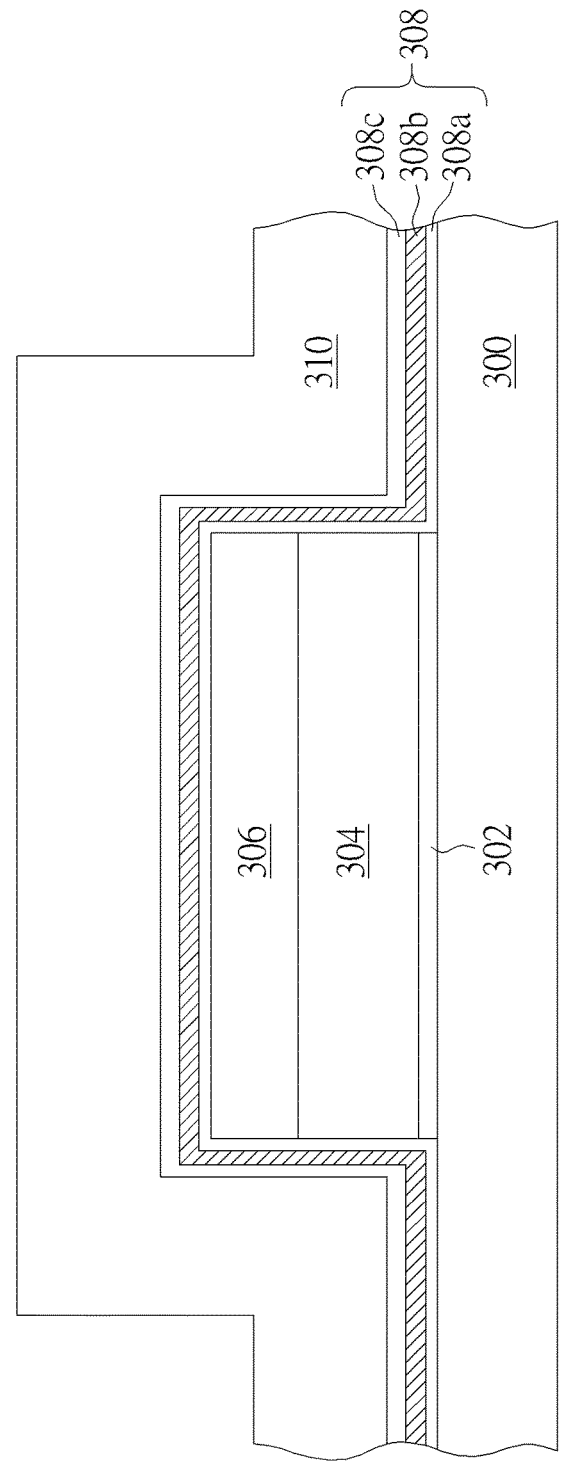

MEMORY CELL AND MANUFACTURING METHOD THEREOF

BACKGROUND OF THE INVENTION

1. Field of the Invention

The present invention relates to a memory cell and a manufacturing method thereof, and more particularly, to a memory cell with an L-shaped patterned material layer and a manufacturing method thereof.

2. Description of the Prior Art

Semiconductor memory devices used for storing data can be divided into volatile devices and non-volatile devices. Volatile memory devices lose data stored therein when a supply voltage is interrupted, while non-volatile memory devices retain the data stored therein even if the supply voltage is interrupted. Accordingly, non-volatile memory devices are widely used when the supply voltage is not always applied or often interrupted, or when a device requires only a low voltage, such as a mobile telephone, a memory card for storing music and/or image data, and other application devices.

Cell transistors of the non-volatile memory device have a stacked gate structure. The stacked gate structure includes a gate insulating layer which is sequentially stacked on a channel region of the cell transistor, a floating gate electrode, an insulating layer between gates, and a control gate electrode. The non-volatile memory device often can be formed by a silicon layer in which a channel region is formed, an oxide layer which forms a tunneling layer, a nitride layer which is used as a charge trapping layer, an oxide layer which is used as a blocking layer, and a silicon layer which is used as a control gate electrode. This structure is referred to as a silicon-oxide-nitride-oxide-silicon (or SONOS) cell structure.

A conventional SONOS memory cell can perform forward read and reverse read to store electrons in the right side or left side of the charge trapping layer. With the shrinkage of semiconductor devices, however, the size of the charge trapping layer is reduced and the electrons stored therein are becoming fewer as well. This results in increased errors of the memory devices when programming or reading devices and thus affects the reliability of semiconductor products.

SUMMARY OF THE INVENTION

The present invention therefore provides a memory cell with good reliability and a manufacturing method thereof.

According to one embodiment, the present invention provides a memory cell, which includes a substrate, a gate dielectric layer, a patterned material layer, a selection gate and a control gate. The gate dielectric layer is disposed on the substrate. The patterned material layer is disposed on the substrate, wherein the patterned material layer comprises a vertical portion and a horizontal portion. The selection gate is disposed on the gate dielectric layer and at one side of the vertical portion of the patterned material layer. The control gate is disposed on the horizontal portion of the patterned material layer and at another side of the vertical portion, wherein the vertical portion protrudes over a top of the selection gate.

According to another embodiment, the present invention provides a memory cell, which includes a substrate, a gate dielectric layer, a patterned material layer, a selection gate, a control gate, a spacer and a silicide. The gate dielectric layer is disposed on the substrate. The patterned material layer is disposed on the substrate, wherein the patterned material layer comprises a vertical portion and a horizontal portion. The selection gate is disposed on the gate dielectric layer and at one side of the vertical portion of the patterned material layer. The control gate is disposed on the horizontal portion of the patterned material layer and at another side of the vertical portion, wherein the vertical portion protrudes over a top of the selection gate. The spacer disposed on a sidewall of the vertical portion of the patterned material layer. The silicide layer disposed on the top of the selection gate and on a top of the control gate, wherein the top of the selection gate and the top of the control gate are completely covered by both the silicide layer and the spacer.

According to another embodiment, the present invention provides a manufacturing method of a memory cell. A substrate is provided, and a patterned dielectric layer, a patterned first conductive layer and a patterned mask layer are formed on the substrate. Next, a material layer and a second conductive layer are formed conformally on the patterned dielectric layer, the patterned first conductive layer, and the patterned mask layer on the substrate. Then, the second conductive layer and the material layer are anisotropically removed. A portion of the patterned mask layer, a portion of the patterned first conductive layer and a portion of the patterned dielectric layer are removed away. Lastly, the patterned mask layer is completely removed, thereby forming two symmetrical memory cells.

The present invention provides a memory cell with various embodiments and a method of manufacturing the same. Since the patterned material layer of the memory cell protrudes over the selection gate, the formed silicide layer will not be formed continuously between the control gate and the selection gate, avoiding the short problem in conventional arts. The performance of the memory cell can therefore be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 show schematic diagrams of the manufacturing method of the memory cell according to one embodiment of the present invention.

DETAILED DESCRIPTION

Figure 3:
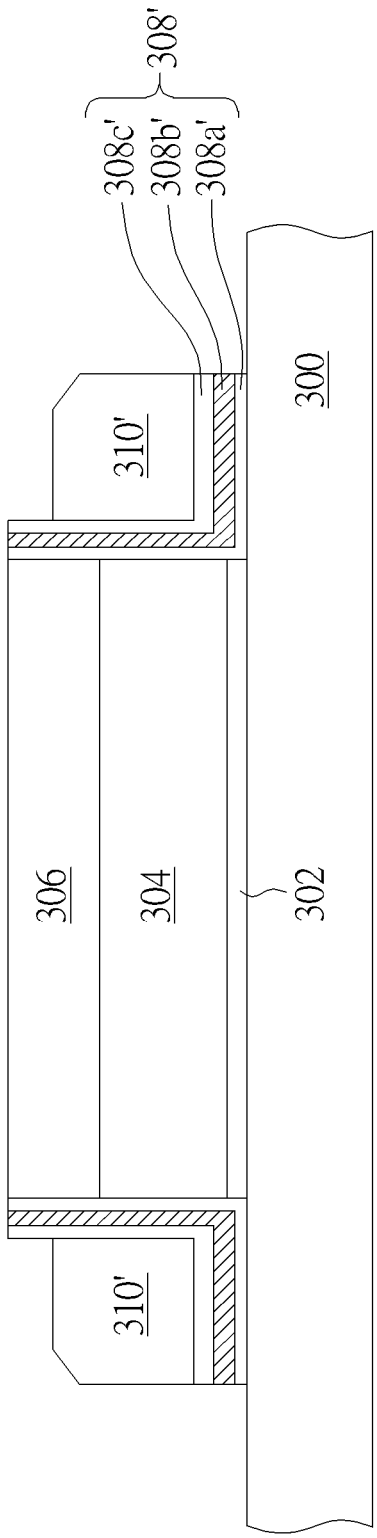

To provide a better understanding of the presented invention, preferred embodiments will be described in detail. The preferred embodiments of the present invention are illustrated in the accompanying drawings with numbered elements.

Please refer to FIG. 1 to FIG. 10, which show schematic diagrams of the manufacturing method of the memory cell according to one embodiment of the present invention. As shown in FIG. 1, a substrate 300 is provided and a patterned dielectric layer 302, a patterned first conductive layer 304 and a patterned mask layer 306 are formed on the substrate 300. For example, a dielectric layer (not shown), a first conductive layer (not shown) and a mask layer (not shown) are deposited on the substrate 300 and then a photo-etching-process (PEP) is performed to pattern the dielectric layer, the first conductive layer and the mask layer, thereby forming the patterned dielectric layer 302, the patterned first conductive layer 304 and the patterned mask layer 306, respectively. In one preferred embodiment, the above layers are formed by one single etching process so the patterned dielectric layer 302, the patterned first conductive layer 304 and the patterned mask layer 306 contain vertically aligned sidewalls. In one embodiment, the substrate 300 can be a silicon substrate, an epitaxial silicon substrate, a silicon germanium substrate, a silicon carbide substrate or a silicon-on-insulator (SOI) substrate. The patterned dielectric layer 302 can include a dielectric material such as $SiO_2$, and in one preferred embodiment, it includes a high-k dielectric material such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The patterned first conductive layer 304 can be any conductive material, and in one embodiment, it is poly-silicon. The patterned mask layer 306 can be any materials suitable as a mask layer, such as silicon nitride (SiN), silicon oxynitride (SiON), silicon carbide (SiC) or their combination. In one embodiment, the patterned mask layer 306 has a thickness substantially between 500 angstroms and 1500 angstroms.

As shown in FIG. 2, a material layer 308 and a second conductive layer 310 are formed conformally on the patterned dielectric layer 302, the patterned first conductive layer 304 and the patterned mask layer 306. In one embodiment, the material layer 308 comprises a first oxide layer 308a, a nitride layer 308b, and a second oxide layer 308c, thereby forming an ONO structure. Each layer of the ONO structure of the material layer 308 can be formed by different fabrication method. In one embodiment, all the first oxide material layer 308a, the nitride material layer 308b, and the second oxide material layer 308c are formed by chemical vapor deposition (CVD) processes for example. The second conductive layer 310 can be any conductive material, for example, poly-silicon.

As shown in FIG. 3, an etching process is carried out to anisotropically remove a part of the second conductive layer 310 and a part of the material layer 308. Referring to the second conductive layer 310, after the etching process, the second conductive layer 310' has a spacer structure with a curved sidewall at two sides of the patterned mask layer 306. In one embodiment, as shown in FIG. 3, a topmost of the second conductive layer 310' is lower than a topmost of the patterned mask layer 306 but is higher than a topmost of the patterned first conductive layer 304. In another embodiment, a topmost of the second conductive layer 310' levels with a topmost of the patterned mask layer 306. Referring to the material layer 308, after the etching process, the material layer 308 contacting only the substrate 300 is removed away. That is, the part of the material layer 308 surrounding the second conductive layer 310' and the patterned mask layer 306 is remained on the substrate 300. In this embodiment, the material layer 308 therefore becomes the material layer 308' (including the first oxide material layer 308a', the nitride material layer 308b', and the second oxide material layer 308c'.).

Figure 4:
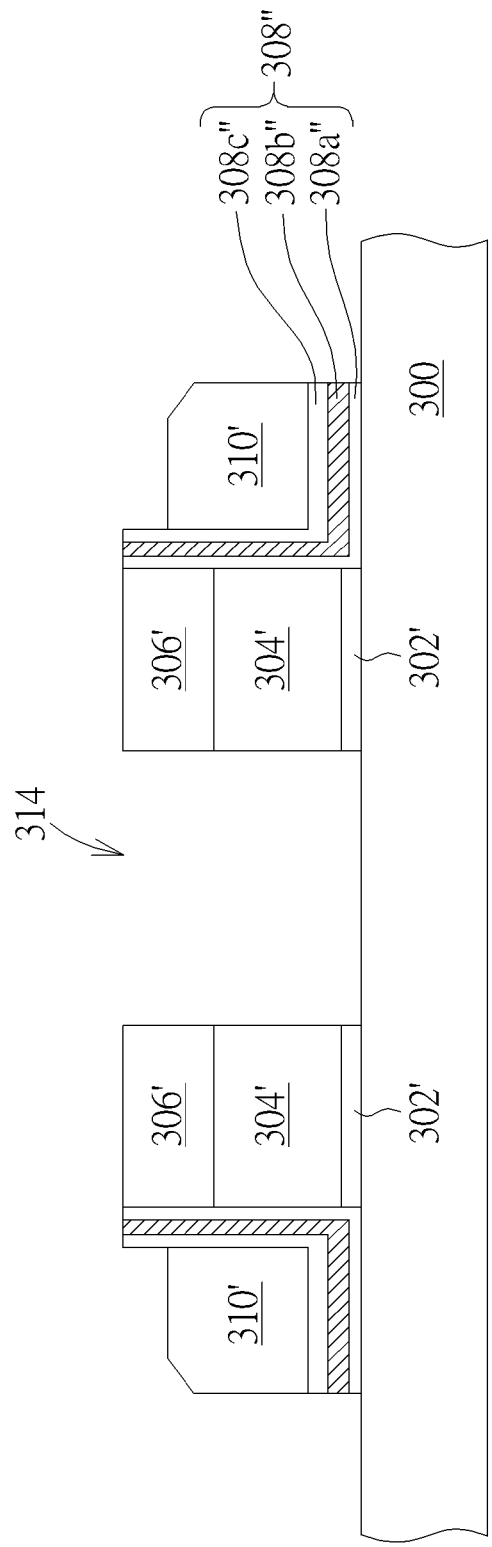

As shown in FIG. 4, an etching process is carried out to remove a part of the material layer 308', a part of the patterned mask layer 306, a part of the patterned first conductive layer 304, a part of the patterned dielectric layer 302, until exposing the substrate 300. A trench 314 is therefore formed. In one preferred embodiment, the remained material layer 308"(including the first oxide material layer 308a", the nitride material layer 308b", and the second oxide material layer 308c" in this embodiment), the patterned mask layer 306', the patterned first conductive layer 304' and the patterned dielectric layer 302' are symmetrical along a central line of the trench 314.

Figure 5:
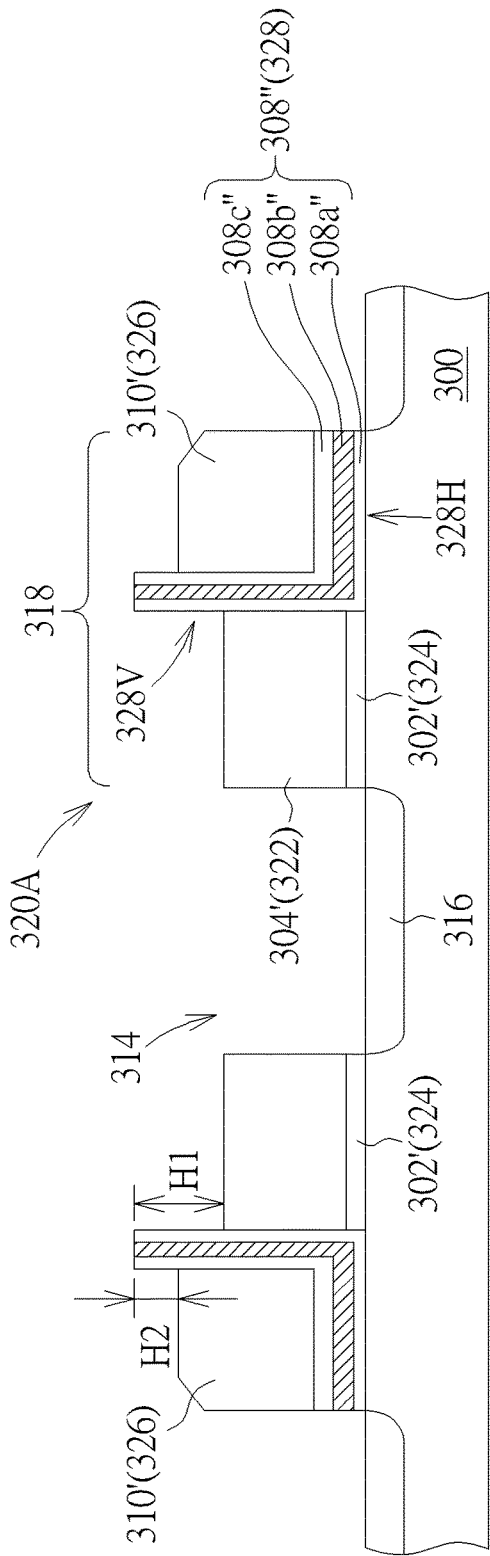

Next, as shown in FIG. 5, the patterned mask layer 306' as well as the material layer 308" above the patterned mask layer 306' is completely removed from the substrate 300. By doing this, two separated gate stack structures 318 are formed on the substrate 300 and each of which is mirror symmetrical with each other along the trench 314. Each gate stack structure 318 includes the patterned dielectric layer 302', the patterned first conductive layer 304', the material layer 308" and the second conductive layer 310'. Thereafter, an implant process is carried out by using the gate stack structure 318 as a mask, thereby forming a first doping region 316 is in the substrate 300 at two sides of the gate stack structure 318. A memory cell 320A can be formed.

As shown in FIG. 5, the memory cell 320A includes the substrate 300, a gate dielectric layer 324 (formed from the patterned dielectric layer 302'), a selection gate 322 (formed from the patterned first conductive layer 304'), a patterned material layer 328 (formed from the material layer 308"), a control gate 326 (formed from the second conductive layer 308') and the first doping region 316. The patterned material layer 328 is can used as a charge trapping layer. The patterned material layer 328 has an L-shaped structure that comprises a vertical portion 328V and a horizontal portion 328H. The selection gate 322 is disposed on the gate dielectric layer 324 and at one side of the vertical portion 328V. The control gate 326 is disposed on the horizontal portion 328H and at another side of the vertical portion 328V. The vertical portion 328V protrudes over atop of the selection gate 322. Preferably, the vertical portion 328V protrudes over a top of the selection gate 322 and a top of the control gate 326. In one embodiment, the vertical portion 328V protrudes over the top of the selection gate 322 by a height H1 substantially between 500 angstroms and 1500 angstroms, and protrudes over the top of the control gate 326 by a height H2 substantially between 200 angstroms and 1000 angstroms. The top of the control gate 326 is higher than the top of the selection gate 322 by 100 angstroms to 300 angstroms.

Figure 6:
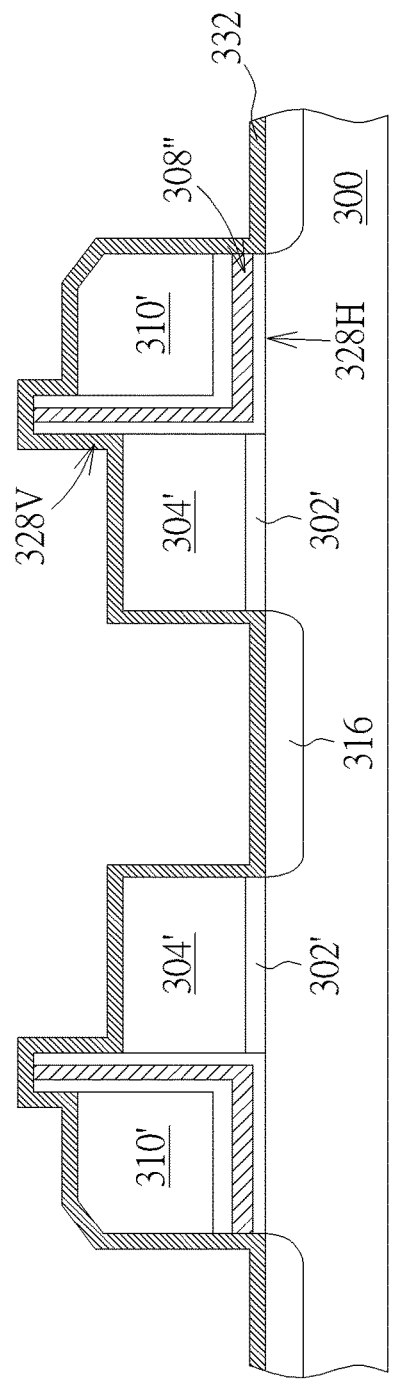
Figure 7:
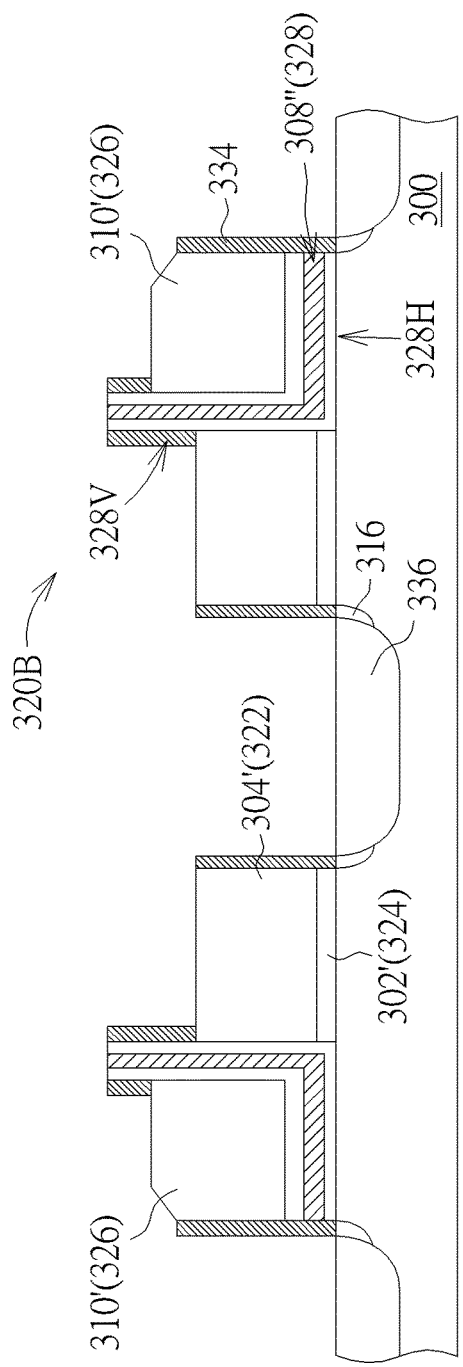

In one embodiment, a plurality of processes can be carried out to form different embodiments of the memory cell. As shown in FIG. 6, a first layer 332 is formed on the substrate 300, conformally covering the gate stack structure 318. In one embodiment, the first layer 332 comprises SiN. As shown in FIG. 7, an etching process is carried out to anisotropically remove a part of the first layer 332, so the first layer 332 at the exposed sidewall of the gate stack structure 318 becomes a first spacer 334. In another embodiment, an implant process can be formed by using the gate stack structure 318 and the first spacer 334 as a mask, thereby forming a second doping region 336. In one embodiment, a concentration of the second doping region 336 is greater than that of the first doping region 316. A memory cell 320B is therefore formed. Besides the structure in memory cell 320A, the memory cell 320B further comprises a second doping region 336 and a first spacer 334, wherein the first spacer 334 is disposed on a sidewall of the exposed vertical portion 328V, a sidewall of the selection gate 322 and a sidewall of the control gate 326 and the horizontal portion 328H.

Figure 8:
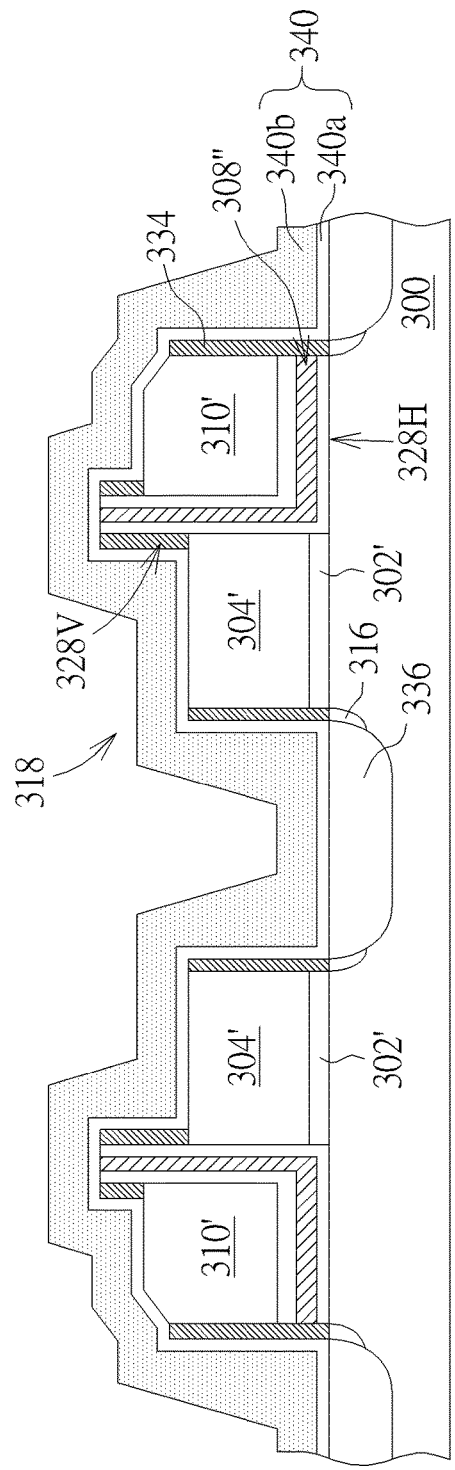
Figure 9:
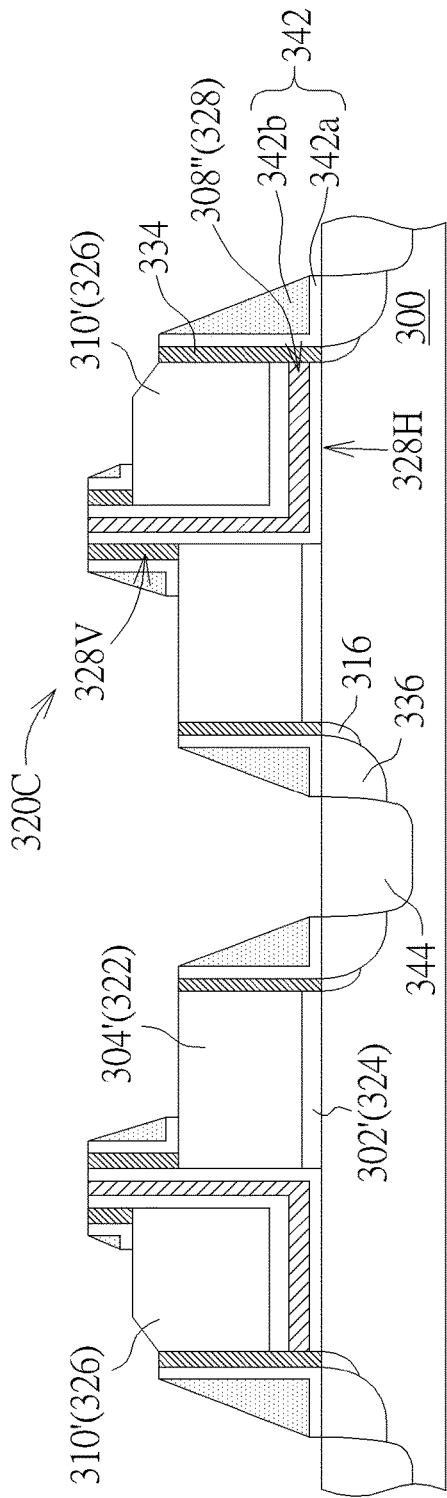

Optionally, as shown in FIG. 8, a second layer 340 is formed on the substrate 300, conformally covering the gate stack structure 318 and the first spacer 334. In one embodiment, the second material layer 340 is a multi-layered structure, for example, a multi-layered structure including an oxide layer 340a and a nitride layer 340b. As shown in FIG. 9, an etching process is carried out to anisotropically remove a part of the second layer 340, so the second layer 340 on the exposed sidewall of the first spacer 334 becomes a second spacer 342 (including the oxide layer 342a and the nitride layer 342b in this embodiment). In another embodiment, an implant process can be formed by using the gate stack structure 318, the first spacer 334 and the second spacer 340 as a mask, thereby forming a third doping region 344. In one embodiment, a concentration of the third doping region 344 is greater than that of the second doping region 336, and the concentration of the second doping region 336 is greater than that of the first doping region 316. The memory cell 320C is therefore formed. Besides the structure in memory cell 320B, the memory cell 320C further comprises a third doping region 344 and a second spacer 342, wherein the second spacer 342 is disposed on a sidewall of the first spacer 334.

Figure 10:
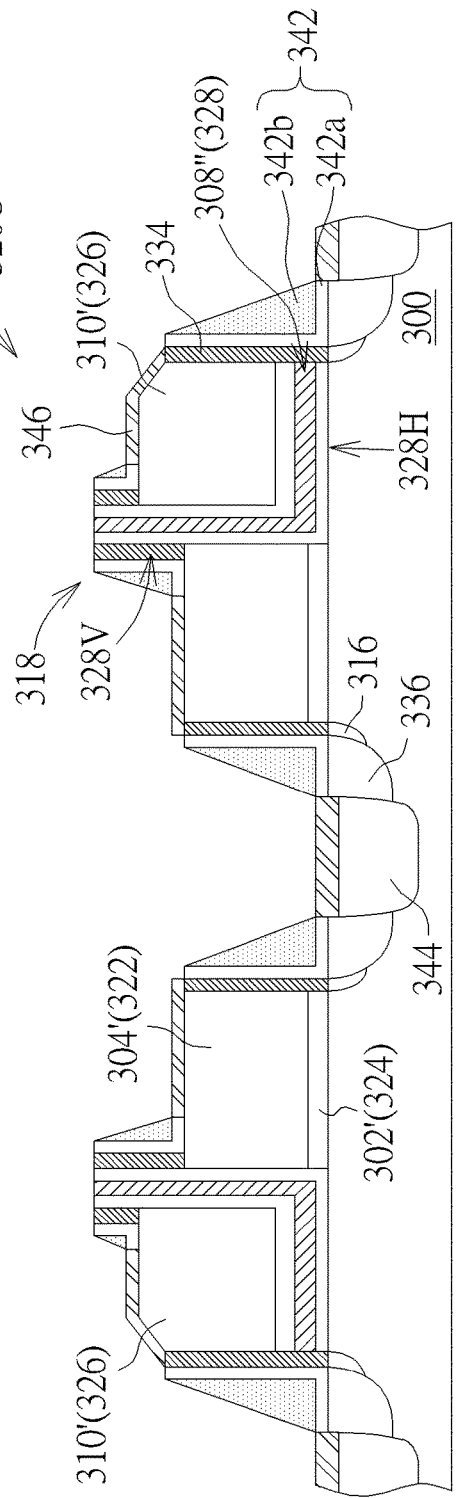

Optionally, as shown in FIG. 10, a silicide layer 346 can be formed on the exposed third doping region 344 and the gate stack structure 318 (including the exposed portion of the control gate 326 and the selection gate 322). The step of forming the silicide layer 346, for example, is a self-aligned silicide formation process (salicide process), which includes forming a metal layer (not shown) such as Co conformally covering the substrate 300, the gate stack structure 318, the first spacer 334 and the second spacer 342, then performing an annealing process to form the silicide layer 346, and removing the unreacted metal layer.

Since the first spacer 334 and the second spacer 342 are disposed on the substrate 300 and the gate stack structure 318, the silicide layer 346 can be formed in a self-aligned manner, positioned on the portion not covered by the first spacer 334 and the second spacer 342. The top of the selection gate 322 and the top of the control gate 326 are completely covered by both the silicide layer 346, the first spacer 334 and the second spacer 342. That is, the silicide layer 346 does not overlap with the first spacer 334, the second spacer 342 along the horizontal direction. It is another advantage in the present invention that, since the vertical portion 328V as well as the first spacer 334 and the second spacer 342 is disposed between the control gate 326 and the selection gate 322 and protrudes thereover, the silicide layer 346 will not be formed continuously between the control gate 326 and the selection gate 322, avoiding the short problem between the control gate 326 and the selection gate 322 in conventional arts. Moreover, due to the curved shape of the second spacer 342 and/or the first spacer 334, the metal layer (not shown) for forming silicide layer 346 can be formed more gently without a vertical portion, so the silicide layer 346 can be formed more precisely in the desired position. Accordingly, the performance and the yield of the memory cell can be improved. It is noted that the embodiment of the silicide layer 346 can be incorporated into any embodiments of the memory cell 320A, 320B, 320C, 320D in the present invention.

Figure 11:
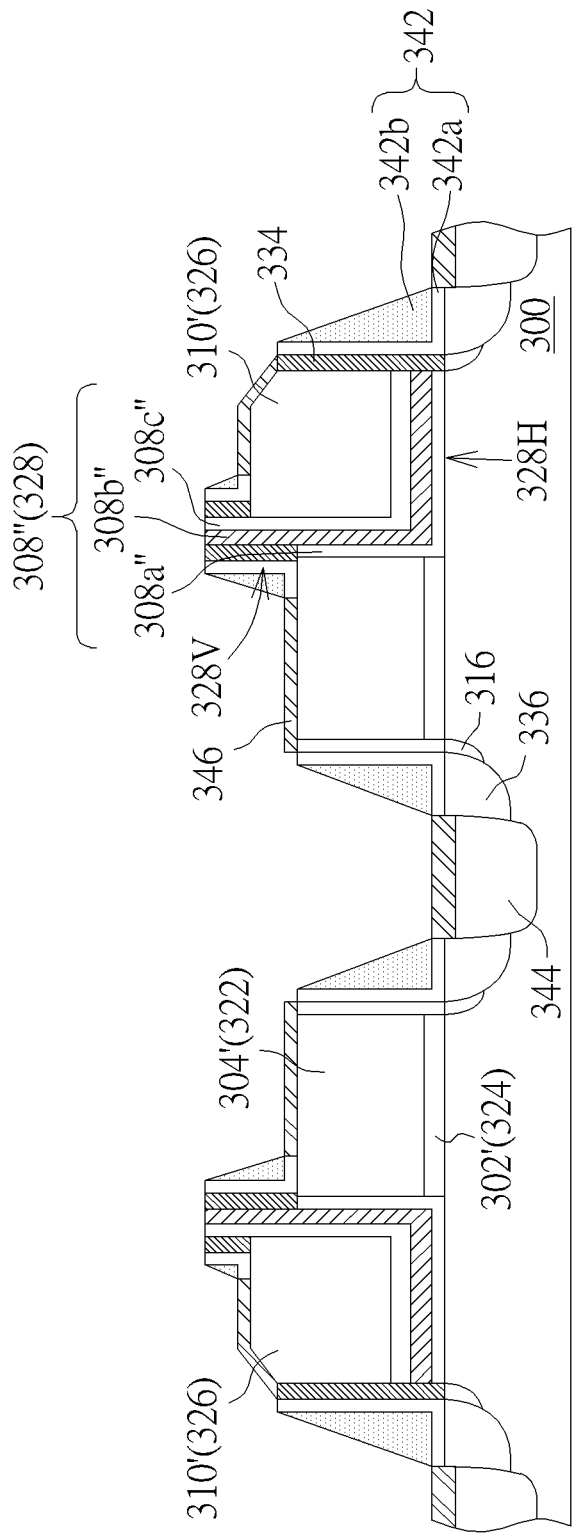
FIG. 11 shows a schematic diagram of the memory cell according to another embodiment of the present invention.

Please refer to FIG. 11, which shows a schematic diagram of the memory cell according to another embodiment of the present invention. In the present embodiment, as shown in FIG. 11, the material layer 308 includes the first oxide layer 308a, the nitride layer 308b, and the second oxide layer 308c, wherein the first oxide layer 308a is formed by a thermal oxidation process. Please also refer to FIG. 2, because the thermal oxidation process forms oxide layer preferably on semiconductor silicon layer instead of nitride layer, the first oxide layer 308a is only formed on the top surface of the substrate 300 and the sidewall of the patterned first conductive layer 304 (which is made of poly-silicon), but is not formed on the sidewall of the patterned mask layer 306 (which is made of SiN). Accordingly, as shown in FIG. 11, in this embodiment, the topmost portion of the first oxide layer 308a of the memory cell 320D is level with the topmost of the selection gate 322 (which is formed from the patterned first conductive layer 304), while only the nitride layer 308b and the second oxide layer 308c protrude over the selection gate 322.

In light of above, the present invention provides a memory cell with various embodiments and a method of manufacturing the same. Since the patterned material layer of the memory cell protrudes over the selection gate, the formed silicide layer will not be formed continuously between the control gate and the selection gate, avoiding the short problem between the control gate and the selection gate due to the silicide layer in conventional arts. Thus, the performance of the memory cell can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell, comprising:
   a substrate;
   a gate dielectric layer disposed on the substrate;
   an L-shaped patterned material layer disposed on the substrate, wherein the L-shaped patterned material layer comprises a vertical portion and a horizontal portion, and the L-shaped patterned material layer comprises a first oxide layer, a nitride layer and a second oxide layer;
   a selection gate disposed on the gate dielectric layer and at one side of the vertical portion of the patterned material layer, wherein a topmost of the first oxide layer levels with a top of the selection gate;
   a control gate disposed on the horizontal portion of the patterned material layer and at another side of the vertical portion, wherein the vertical portion protrudes over the top of the selection gate and a topmost of the control gate; and
   a silicide layer disposed on the topmost of the control gate, wherein a topmost of the vertical portion is higher than a topmost of the silicide layer.

2. The memory cell according to claim 1, further comprising a spacer disposed on a sidewall of the vertical portion of the patterned material layer.

3. The memory cell according to claim 2, wherein the spacer comprises a first spacer and a second spacer.

4. The memory cell according to claim 1, wherein the topmost of the control gate is higher than the top of the selection gate.

5. The memory cell according to claim 4, wherein the topmost of the control gate is higher than the top of the selection gate by a height between 100 angstroms and 300 angstroms.

6. The memory cell according to claim 1, wherein the vertical portion protrudes over the top of the selection gate by a height substantially between 500 angstroms and 1500 angstroms.

7. The memory cell according to claim 1, wherein the silicide layer is further disposed on the top of the selection gate.

* * * * *